US006231775B1

(12) United States Patent
Levenson et al.

(10) Patent No.: US 6,231,775 B1
(45) Date of Patent: May 15, 2001

(54) PROCESS FOR ASHING ORGANIC MATERIALS FROM SUBSTRATES

(75) Inventors: Eric O. Levenson, Los Altos; Ahmad Waleh, Palo Alto, both of CA (US)

(73) Assignee: Anon, Inc., San Jose, CA (US)

( * ) Notice: Subject to any disclaimer, the term of this patent is extended or adjusted under 35 U.S.C. 154(b) by 0 days.

(21) Appl. No.: 09/407,014

(22) Filed: Sep. 28, 1999

Related U.S. Application Data

(63) Continuation-in-part of application No. 09/014,695, filed on Jan. 28, 1998, now abandoned.

(51) Int. Cl.$^7$ .................................................. H01L 21/3065
(52) U.S. Cl. ............................ 216/67; 438/725; 252/79.1
(58) Field of Search ............................... 438/725; 216/67; 252/79.1

(56) References Cited

U.S. PATENT DOCUMENTS

| | | | |
|---|---|---|---|
| 3,607,087 | * 9/1971 | Graham | 23/252 |
| 4,473,437 | 9/1984 | Higashikawa et al. | 156/643 |
| 4,699,689 | 10/1987 | Bersin | 156/643 |
| 4,701,301 | * 10/1987 | Kuwahara et al. | 419/21 |
| 4,789,427 | 12/1988 | Fujimura et al. | 156/643 |
| 4,820,580 | * 4/1989 | Hocker etl al. | 428/314.4 |
| 4,961,820 | 10/1990 | Shinagawa et al. | 156/643 |
| 5,286,532 | * 2/1994 | Yoshikawa et al. | 427/536 |
| 5,447,598 | 9/1995 | Mihara et al. | 216/46 |
| 5,447,799 | * 9/1995 | Loh et al. | 428/448 |
| 5,487,967 | 1/1996 | Hutton et al. | 430/322 |
| 5,560,803 | 10/1996 | Mihara et al. | 156/643.1 |
| 5,723,630 | * 3/1998 | Cheburkov et al. | 549/89 |
| 5,763,016 | 6/1998 | Levenson et al. | 427/510 |
| 5,824,604 | * 10/1998 | Bar-Gadda | 438/725 |

FOREIGN PATENT DOCUMENTS

| | | |
|---|---|---|
| 4-075323 | 3/1992 | (JP) . |
| 5-304089 A2 | 11/1993 | (JP) . |

* cited by examiner

Primary Examiner—Anita Alanko
(74) Attorney, Agent, or Firm—David W. Collins

(57) ABSTRACT

Ashing of an organic film from a substrate is carried out by providing a plasma comprising a gas or gas mixture selected from the following groups: (a) sulfur trioxide alone; (2) sulfur trioxide plus one supplemental gas; and (3) sulfur trioxide plus at least two supplemental gases. Any of the following gases may be employed as the supplemental gas: oxygen, ozone, hydrogen, nitrogen, nitrogen oxides, helium, argon, or neon. Also, a process is provided for forming a plasma in a reaction chamber from reactant gases containing sulfur trioxide. The process includes introducing the sulfur trioxide into the reaction chamber from a storage vessel through a delivery manifold by independently heating the storage vessel and the delivery manifold to a temperature sufficient to maintain the sulfur trioxide in its gaseous state or liquid state and by heating the reaction chamber to control the reaction rate of the sulfur trioxide and also control condensation of the sulfur trioxide to maintain a stable plasma state.

37 Claims, No Drawings

PROCESS FOR ASHING ORGANIC MATERIALS FROM SUBSTRATES

CROSS-REFERENCE TO RELATED APPLICATION

The present application is a continuation-in-part application of application Ser. No. 09/014,695, filed Jan. 28, 1998 now abandoned.

BACKGROUND OF THE INVENTION

1. Field of the Invention

The present invention relates generally to the removal of organic materials on various substrates, and, more particularly, to an ashing method for removing organic films and materials temporarily formed on various substrate layers during fabrication of semiconductor, flat panel display, read/write heads, and other related devices.

2. Description of the Related Art

Removal of the photoresist film is an important part of the process of fabricating semiconductor devices. The use of ashing methods, in particular, using a gas with high oxygen content, for removing organic films, such as resists and polyimides has been known for some time. The advances in plasma tools and the related processing techniques, over the last decade, have managed to keep up with the challenges of successive generations of Very Large Scale Integration (VLSI) and Ultra Large Scale Integration (ULSI) devices. However, as the size of the features and the thickness of films in these devices continue to decrease, the manufacturing challenges are also renewed with every generation of Integrated Circuits (ICs).

As the dramatic shrinking of IC geometries continues, the ashing methods are continuously faced with two problems: (a) achieving higher rates of residual-free resist removal and (b) lowering the amount of damage caused in the substrate layers underlying the resist film. These generally conflicting objectives are addressed by changing either the physical conditions of the plasma medium or the chemical conditions of the ashing process. For example, one can achieve higher rates of processing by either generating a dense plasma environment or by using or generating, in the plasma environment, chemical species that react more efficiently with the resist.

Substrate damage can likewise be attributed to both physical and chemical conditions of the plasma. For example, charging and ion bombardment effects are directly related to the physical properties of the plasma. Energetic ions can drive small quantities of heavy metal (i.e., Fe, Cu and Pb) and alkaline metal (i.e., Na and K) atoms, which are generally present as impurities in the resist films, into the substrate layer underneath the resist. The heavy metal contamination and in particular the subsequent permeation and migration of heavy metals into other substrates (e.g. silicon) layers can affect the minority carrier lifetime to the detriment of the device properties. Such bombardment effects become more severe as the resist films become thinner towards the end of the ashing process, particularly as the thickness of sensitive substrates are designed to be thinner.

Substrate damage also results from the chemical properties of plasma, such as etching or other poisonous effects on the layer underneath the resist. For example, etching of silicon oxide ($SiO_2$) occurs because of fluorine (F), when halogenated gas mixtures such as oxygen ($O_2$) and tetrafluoromethane ($CF_4$) are used to increase the rate of plasma ashing. Similarly, energetic oxygen ions can contribute to the formation water inside the surface layers of spin-on-glass (SOG) films, resulting in an increase in the dielectric constant or in the related via-poisoning phenomenon.

These considerations apply, to various degrees depending on the application, to all conventional dry-etch plasma etchers, e.g., barrel, down-stream or parallel-electrode configurations, with the down-stream ashing being the most widely used method. To increase the processing rates and minimize the problem of ion damage, techniques for higher plasma densities and lower ion energies may be employed. The new generations of advanced plasma sources achieve these objectives by decoupling the control of the plasma density from the control of ion energy in the plasma by such techniques as Electronic Cyclotron Resonance (ECR) or Inductively Coupled Plasma (ICP) in microwave or radio frequency power regimes. The art of these and other types of plasma technologies and plasma tools are well known and have been the subject of many US patents.

Independent of the nature and the regime of the plasma employed, the rate and completeness of ashing as well as any unwanted etching or damage to the substrate layer, in the conventional ashing tools, are strongly influenced by the chemical reactions between the resist and the substrate layer and the reactive ionic, neutral and radical species generated in the plasma. In a typical down-stream or other conventional asher, the nature of the plasma gas mixture is the primary determinant of the ashing rate which is also sensitive to the "ashing temperature". The nature of the gas mixture also influences the activation energy of ashing which is a measure of the sensitivity of the ashing rate to the ashing temperature.

The activation energy is obtained from the gradient of the Arrhenius plot which is a line plot of the ashing rate as a function of the inverse ashing temperatures. Therefore, a small activation energy (small slope of the Arrhenius plot) indicates that ashing rate is less sensitive to ashing temperature, and that the ashing process will be more stable and uniform. Lower activation energies also imply that the ashing temperature can be lowered without significant loss of ashing rate. This is particularly useful where VLSI or ULSI fabrication requires lower processing temperatures and yet where acceptable practical levels of ashing rates (i.e., >0.5 $\mu$m/min) must be maintained.

A thorough discussion of ashing rates and activation energies for a series of gas mixtures consisting of one or more of the following oxygen, hydrogen, nitrogen, water vapor and halogenide gases is given in the U.S. Pat. No. 4,961,820. It is shown that addition of nitrogen to oxygen plasma does not change the activation energy (0.52 eV for oxygen) and improves the rate of ashing only slightly (from 0.1 to 0.2 $\mu$m/min at 160° C.). However, addition of 5 to 10% hydrogen or water vapor to oxygen reduces the activation energy to about 0.4 eV with a similar improvement in the ashing rate as in the case of nitrogen addition. Addition of both nitrogen and 5 to 10% of either hydrogen or water vapor to oxygen plasma has a synergistic effect of increasing the ashing rate to a more practical level of 0.5 $\mu$m/min (at 160° C.).

The most dramatic improvements in the activation energy (down to 0.1 eV) and the ashing rate (>1.5 $\mu$m/min) are obtained when a halogenide (e.g., tetrafluoromethane) is added to the oxygen plasma. However, in this case, $CF_4$ also results in etching of such substrate layers as silicon oxide, polysilicon and aluminum due to fluorine reaction. It is reported that inclusion of water vapor in the reactant gas mixture will reduce the damage by $CF_4$ apparently as a result of the reaction of water with $CF_4$, thus suppressing the halogen action.

As seen from the above discussion, the search for a satisfactory reactant gas mixture, with reasonably high ashing rate and without any deleterious effect on the substrate layer underneath the resist film, continues. Furthermore, as the constraints of the VLSI and ULSI fabrication become more stringent, lower ashing temperatures and ashing-process stability (lower activation energy) increasingly become major requirements of a satisfactory reactant gas mixture.

SUMMARY OF THE INVENTION

It is an object of the present invention to provide an improved process for ashing organic materials, including photoresist residues, from substrates by including sulfur trioxide gas as a part of the reactive gas mix.

It is another major object of the present invention to provide an effective process, with favorable characteristics, for ashing organic materials, including photoresist residues, from a variety of substrate materials without requiring the use of damaging halogenide, or halide-containing, gases.

These, and other objects of the present invention, can be accomplished by employing one of three groups of gas mixes in the ashing process. These mixes include (1) Group 1 gas, which comprises only sulfur trioxide gas; (2) Group 2 gases, which comprise a mixture of sulfur trioxide and a supplemental gas such as oxygen, ozone, hydrogen, nitrogen, nitrogen oxides, helium, argon, or neon; and (3) Group 3 gases, which comprise a mixture of sulfur trioxide and at least two of the foregoing supplemental gases.

As is well-known in the art, when certain of these supplemental gases are added to the main reactive ashing gas in the appropriate quantities and at the appropriate time in the process, they promote favorable ashing process characteristics and organic film removal performance. Such favorable characteristics and performance includes (a) higher ashing rates, (b) lower activation energies, and (c) absence of ground layer etching during the organic removal process.

By utilizing an ashing gas mixture which excludes halogenide, or halide10 containing, and hydrocarbon-containing gases, the present invention promotes favorable ashing process characteristics and eliminates damaging effects to the substrate, such as gate oxide erosion and line-lifting, which are attributable to halide-containing gas mixtures; see, e.g., "Eliminating Heavily Implanted Resist in Sub-0.25-um devices", MICRO, July/August 1998, page 71).

Further in accordance with the present invention, the process for removing an organic material from a surface of a substrate comprises the steps of:
  (a) placing the substrate in a reaction chamber;
  (b) introducing into the reaction chamber a halogen-free and hydrocarbon-free reactant gas comprising sulfur trioxide and, optionally, from 5 to 99 volume percent of at least one supplemental gas selected from the group consisting of oxygen, ozone, hydrogen, nitrogen, nitrogen oxides, helium, argon, and neon;
  (c) creating a plasma from the reactant gas; and
  (d) allowing the plasma to impinge upon the surface of the substrate containing the organic material for a time sufficient to ash the organic material but insufficient to attack the surface of the substrate.

Also in accordance with the present invention, a process is provided for forming a plasma in a reaction chamber from reactant gases containing sulfur trioxide. The process includes introducing the sulfur trioxide into the reaction chamber from a storage vessel through a delivery manifold by independently heating the storage vessel and the delivery manifold to a temperature sufficient to maintain the sulfur trioxide in its gaseous state or liquid state and by heating the reaction chamber to control the reaction rate of the sulfur trioxide and also control condensation of the sulfur trioxide to maintain a stable plasma state.

DESCRIPTION OF THE PREFERRED EMBODIMENTS

The present inventors have successfully used anhydrous sulfur trioxide ($SO_3$) in non-plasma resist removal applications at temperatures substantially lower than 200° C. Experiments have shown that exposure of resist-covered substrate surfaces to $SO_3$ leaves polysilicon and metal substrates surfaces intact without any deleterious effect. Exposed silicon and metal surfaces are also protected because of passivation action of sulfur trioxide. Therefore, sulfur trioxide appears as a suitable candidate, either alone or in a reactant gas mixture, for plasma ashing applications.

Furthermore, the inventors have successfully demonstrated that the reaction of sulfur trioxide with an organic substrate proceeds mainly through sulfonation, sulfation and sulfamation reactions, thus changing the chemical nature of the organic substrate making it more hydrophilic. In certain cases, sulfur trioxide can also act as an oxidizer, further modifying the chemical nature and composition of the organic substrate. Both the hydrophilizing and oxidizing abilities of sulfur trioxide can be selectively enhanced in the presence of other physical and chemical processes for more controlled modification of the substrates. Such changes in the chemical nature of the organic substrate are particularly useful for difficult plasma ashing applications such as hardened resists and sidewall polymers which have been exposed to high-dose implant or oxide-etch processes.

The ability of sulfur trioxide to modify the chemical nature of the organic resist and polymer substrates, in turn, is expected to affect the activation energy of such substrate materials under plasma conditions. Thus, in a plasma environment, sulfur trioxide can lower the activation energy and improve the ashing rate without the use of halogens (e.g. tetrafluoromethane) which are usually added to the oxygen plasma for this purpose. The lowering of the activation energy also results in improved ashing rates at lower temperatures. However, unlike halogen gases, sulfur trioxide will not cause damage to underlying metal and oxide substrates.

Further lowering of the required ashing temperature can result from the modification actions of the sulfur trioxide itself. The inventors have shown that sulfur trioxide reactions with organic substrates proceed efficiently at temperatures well below 150° C. Indeed, the substrate modification via sulfonation, sulfation and sulfamation reactions can occur over a wide range temperatures between room and 200° C. Thus, the inventors expect that, in the presence of sulfur trioxide, the plasma ashing temperature can be extended to very low temperatures. The lowering of the ashing temperature has very important implications in the removal of hardened skins which are formed when photoresists are exposed to very high-dose implant processes. The low-temperature removal of such hardened skins avoids popping problems, which result in residue removal complications during subsequent cleaning steps.

The reactivity of sulfur trioxide will be enhanced in a plasma environment. A sulfur trioxide-containing plasma will include neutral as well as ionized and radical derivatives of the $SO_3$ molecule, all of which are expected to react efficiently with the organic substrates. Furthermore, the presence of $SO_3$ in an oxygen plasma will enhance the formation of oxygen radicals which, in turn, will enhance the rate of ashing.

In summary, sulfur trioxide benefits plasma ashing in two ways. $SO_3$ can be employed in place of a halogen gas to reduce activation energy and improve ashing rate without corrosion problems or damage to underlying silicon oxide layers. A further reduction in the ashing temperature also occurs as a result of the reaction of $SO_3$ with the organic substrates. The ashing properties are further enhanced due to reactions with plasma-activated radical derivatives of sulfur trioxide. Therefore, sulfur trioxide plasma can be used very efficiently to remove hardened resists and sidewall polymers, which are generated following high-dose implant or prolonged fluorinated plasma-etch processes.

An important aspect of using sulfur trioxide as a plasma ashing gas is the delivery and maintenance of gaseous sulfur trioxide in the plasma environment. The physical and thermal characteristics of sulfur trioxide are such that it requires special handling in the source vessel, delivery manifold, and the reaction chamber for its successful utilization in a stable plasma state. Proper control of the temperature and pressure of all apparatus components is essential to ensure successful delivery of sulfur trioxide from a closed, pressurized storage vessel to a low pressure, open-system reaction chamber, under pumping conditions. The sulfur trioxide may be maintained in any mix of 0 to 100 volume percent of solid, liquid, or gaseous state in the storage vessel and in any mix of 0 to 100 volume percent of liquid or gaseous state in the delivery manifold, prior to injection into the reaction chamber. Upon injection of the sulfur trioxide into the reaction chamber, the control of the chamber environment is necessary to maintain an appropriate amount of sulfur trioxide in its gaseous state to maintain a stable plasma condition.

In its gamma form, sulfur trioxide has a melting point of 16.8° C. (62.2° F.) and a boiling point of 44.8° C. (112.6° F.). Polymerization of sulfur trioxide can easily result in the formation of high melting-point beta (32.5° C.) and alpha (62.3° C.) forms. As a result, sulfur trioxide may be employed in any mix of 0 to 100 volume percent of its gamma, beta, and alpha polymeric forms in the storage vessel. Preferably, the gamma form is utilized in the practice of the present invention. In most commercial applications, small quantities of inhibitors (stabilizers) are used to stabilize the gamma state. However, for semiconductor device applications, the non-stabilized gamma form may be more desirable in order to avoid introduction of impurities. Clearly, successful utilization of sulfur trioxide depends on the proper control of pressure and temperature at all three stages of source storage, delivery manifold, and reaction chamber.

The proper control of temperature and pressure is important for several reasons. Repeatability of the system performance requires that, at a minimum, temperature of sulfur trioxide be controlled to maintain a stable gamma form at the source and the uniform delivery of sulfur trioxide in a gaseous state. Manifold heating is also needed to prevent solidification and tube blockage during the delivery of sulfur trioxide to the reaction chamber. The heating of the chamber walls and individual chamber components are also necessary to maintain the gaseous state of sulfur trioxide in the reaction chamber.

The present inventors have exhaustively examined the thermal behavior of sulfur trioxide, and have developed and designed manifold systems for efficient and safe storage, delivery and injection of sulfur trioxide into a reaction chamber. Briefly, the system consists of storage of sulfur trioxide in a temperature-controlled vessel, which can be valved off for emergency isolation. The source temperature can be controlled isothermally and with temperature gradients along the length of the vessel. A gas manifold consisting of an appropriate arrangement of valves and tubes is designed for regulation and delivery of gaseous sulfur trioxide to the reaction chamber. The manifold temperature can be controlled both uniformly and over independent zones as needed, according to the pressure and temperature requirements at the source and in the reaction chamber.

The proper control of temperature in the reaction chamber is particularly critical. The reaction rate and the effectiveness of the sulfur trioxide reaction is sensitive to the reaction temperature and the density of the anhydrous gas at the substrate surface. Any uncontrolled condensation of sulfur trioxide may result in the reduction of anhydrous gas density and loss of performance. Such uncontrolled condensation of sulfur trioxide may also result in accumulation of other molecular species that may change the equilibrium densities in the plasma or result in reaction pathways that may not be as effective or efficient as the anhydrous sulfur trioxide reaction. Similarly, controlled condensation of sulfur trioxide may be used to further enhance sulfur trioxide reaction at the substrate surface or to control the partial pressure of the gaseous sulfur trioxide in the chamber. Thus, the reaction chamber walls and accessories are heated under controlled conditions. Both uniform and independent heating of the chamber components are possible.

Independent heating of the reaction chamber walls and substrate may be necessary, depending on the particular ashing application. As an example, depending on the reacting gas mixture, the reaction chamber walls may be maintained between room temperature and 60° C., to prevent sulfur trioxide condensation on the walls. Simultaneously, the temperature of the substrate surface may be maintained independently between room temperature and 200° C., to control the sulfur trioxide reaction rate at the substrate surface. Finally, the chamber pressure and temperature is controlled and regulated to prevent back flow of any chamber gases into the delivery manifold or source (storage) vessel. Such back flow may result in nucleation of other polymeric forms of sulfur trioxide, change the flow characteristics, and result in plasma instability.

Stripping and plasma ashing of organic photoresists, using one of the three groups of gases described above, are carried out with a conventional down-flow, barrel, downstream, direct, or other type of plasma ashing tool which is known in the prior art. The present invention pertains to the nature of the gases used in the ashing process and has application in all conventional ashing tools. The down-flow, barrel, direct, and downstream and other types of plasma ashing tools are well-known in this art and form no part of this invention.

The basic concept behind this invention is that sulfur trioxide gas, under the appropriate volumes and processing conditions, and with the optional addition of certain supplemental gases, but not including halide-containing or hydrocarbon-containing gases, required to either reduce the activation energy, increase the speed of the ashing process, lower the operating temperature of the ashing process, or otherwise improve the effectiveness or efficiency of the ashing process, is used in gaseous form as a reactant gas mixture to plasma ash, or otherwise react with, all types of organic coatings, films, layers and residues, including process-hardened photoresists, so as to cause them to be substantially removed, cleaned, or stripped from the surface of the substrate. In all embodiments of the present invention, the sulfur trioxide is provided in a source container from which sulfur trioxide gas is supplied to the processing chamber in the quantities and at the appropriate time in the ashing process. Within the source container, sulfur trioxide may be a mix of solid, liquid or gas, with the solid material in alpha form, beta form, gamma form or a mixture thereof.

Specifically, the following organic materials, in the form of coatings, films, layers, and residues, may be removed by the process of the present invention: polymerized and non-polymerized photoresists, photoresist residues, photosensitive and non-photosensitive organic compounds, paints, resins, multilayer organic polymers, organo-metallic complexes, sidewall polymers, via veils, metal fences, hybrid organic/inorganic compounds, dielectric materials, and organic spin-on-glass. The photoresists may comprise positive optical photoresists, negative optical photoresists, electron beam photoresists, X-ray photoresists, and ion-beam photoresists.

Such coatings, films, layers, and residues may have been formed on a variety of substrates, including, but not limited to, in whole or in part, (a) semiconductor wafers and devices comprised of silicon, polysilicon, germanium, III-V materials, and II-VI materials, (b) oxides, (c) nitrides, (d) oxynitrides, (e) dielectric materials, (f) metals and metal alloys, (g) ceramic devices, (h) photomasks, (i) liquid crystal and flat panel displays, (j) printed circuit boards, (k) magnetic read/write heads, and (l) thin film heads.

The ashing process of the invention may be carried out at a temperature within the range of room temperature (about 20° C.) up to 350° C. However, the ashing process is preferably carried out at as low a temperature as possible, consistent with maintaining as high an etching rate as possible. More preferably, then, the ashing process is carried out at a temperature less than about 200° C.

1. The First Embodiment.

One embodiment is a plasma ashing process conducted in any of the conventional down-flow, barrel, direct, and downstream and other types of ashing tools known in the prior art. In this first embodiment, the Group 1 gases are employed for the purpose of creating a plasma. In particular, the reactant gases comprise only sulfur trioxide. Sulfur trioxide is supplied to the plasma generating chamber, which is initially evacuated and exhausted to an appropriate vacuum. The flow rate of the $SO_3$ gas is controlled by a controller during the process. Microwave power is supplied into the plasma generating chamber where a plasma is created with the reactant gases. Active species which are generated as a plasma, flow down to a process chamber and come into contact with the organic film on the surface of the substrate by one of the methods disclosed in the prior art. As a result of the interaction of the organic film and the plasma, the organic film is either removed or chemically changed so as to render the film removable with subsequent rinsing or cleaning steps in the process. The process limitations, such as flow rate, microwave power, and the like are the same as those conventionally employed in the prior art, such as disclosed in U.S. Pat. Nos. 4,669,689 and 4,961,820.

2. The Second Embodiment.

Another embodiment of the present invention is a plasma ashing process conducted in any of the conventional down-flow, barrel, direct, and downstream and other types of ashing tools. In this second embodiment, the Group 2 gases are employed for the purpose of creating a plasma. In particular, the reactant gases comprise sulfur trioxide and one supplemental gas. Sulfur trioxide and the supplemental gas are supplied to the plasma generating chamber, which is initially evacuated and exhausted to an appropriate vacuum. The sulfur trioxide concentration in the Group 2 reactant gas is within the range of about 1 to 95 vol %. The supplemental gas comprises the balance (99 to 5 vol %).

The flow rate of each gas is controlled by a controller during the process. Microwave power is supplied into the plasma generating chamber where a plasma is created with the reactant gases. Active species which are generated as a plasma flow down to a process chamber and come into contact with the organic film on the surface of the substrate by one of the methods disclosed in the prior art. As a result of the interaction of the organic film and the plasma, the organic film is either removed or chemically changed so as to render the film removable with subsequent rinsing or cleaning steps in the process. As above, the process limitations, such as flow rate, microwave power, and the like are the same as those conventionally employed in the prior art.

The supplemental gas may comprise any of the gases selected from the group consisting of oxygen, ozone, hydrogen, nitrogen, nitrogen oxides, helium, argon, and neon. Examples of nitrogen oxides include nitrous oxide ($N_2O$), nitric oxide (NO), nitrogen trioxide ($NO_3$), and nitrogen dioxide ($NO_2$).

3. The Third Embodiment.

Yet another embodiment of the present invention is a plasma ashing process conducted in any of the conventional down-flow, barrel, direct, and downstream and other types of ashing tools. In this third embodiments, the Group 3 gases are employed for the purpose of creating a plasma. In particular, the reactant gases comprise sulfur trioxide and at least two supplemental gases. Sulfur trioxide and the supplemental gases are supplied to the plasma generating chamber, which is initially evacuated and exhausted to an appropriate vacuum. The sulfur trioxide concentration in the Group 3 reactant gas is within the range of about 1 to 95 vol %. The supplemental gas comprises the balance (99 to 5 vol %).

The flow rate of the gas is controlled by a controller during the process. Microwave power is supplied into the plasma generating chamber where a plasma is created with the reactant gases. Active species which are generated as a plasma, flow down to a process chamber and come into contact with the organic film on the surface of the substrate by one of the methods disclosed in the prior art. As a result of the interaction of the organic film and the plasma, the organic film is either removed, or chemically changed so as to render the film removable with subsequent rinsing or cleaning steps in the process. As above, the process limitations, such as flow rate, microwave power, and the like are the same as those conventionally employed in the prior art.

The supplemental gases comprises at least two of the gases from the list of supplemental gases given above.

In each of the foregoing embodiments, removal of organic films, including resist layers, is substantially complete, with little or no damage to the underlying ground layer.

Thus, there has been disclosed a process for removing organic materials from the surface of a substrate, employing a plasma ashing process that uses a reactant gas that contains sulfur trioxide. It will be readily apparent to those skilled in this art that various changes and modifications of an obvious nature may be made, and all such changes and modifications are considered to fall within the scope of the appended claims.

What is claimed is:

1. A process for removing an organic material from a surface of a substrate comprising the steps of:
   (a) creating a plasma from a halogen-free and hydrocarbon-free reactant gas comprising sulfur trioxide and, optionally, from 5 to 99 volume percent of at least one supplemental gas selected from the group consisting of oxygen, ozone, hydrogen, nitrogen, nitrogen oxides, helium, argon, and neon; and
   (b) allowing said plasma to impinge upon said surface of said substrate containing said organic material for a time sufficient to ash said organic material but insufficient to attack said surface of said substrate.

2. The process of claim 1, wherein said reactant gas consists essentially of sulfur trioxide gas.

3. The process of claim 1, wherein said reactant gas consists essentially of sulfur trioxide and one said supplemental gas, said sulfur trioxide having a concentration within a range of about 1 to 95 volume percent.

4. The process of claim 1, wherein said reactant gas consists essentially of sulfur trioxide and at least two said supplemental gases, said sulfur trioxide having a concentration within a range of about 1 to 95 volume percent.

5. The process of claim 1, wherein said nitrogen oxides are selected from the group consisting of nitrous oxide ($N_2O$), nitric oxide (NO), nitrogen trioxide ($NO_3$), and nitrogen dioxide ($NO_2$).

6. The process of claim 1, wherein said organic material comprises a substance selected from the group consisting of polymerized and non-polymerized photoresists, photoresist residues, photosensitive and non-photosensitive organic compounds, paints, resins, multilayer organic polymers, organo-metallic complexes, sidewall polymers, via veils, metal fences, hybrid organic/inorganic compounds, dielectric materials, and organic spin-on-glass.

7. The process of claim 6, wherein said photoresists are selected from the group consisting of positive optical photoresists, negative optical photoresists, electron beam photoresists, X-ray photoresists, and ion-beam photoresists.

8. The process of claim 1, wherein said substrate is selected from the group consisting, entirely or in part, of (a) semiconductor wafers and devices comprised of silicon, polysilicon, germanium, III-V materials, and II-VI materials, (b) oxides, (c) nitrides, (d) oxynitrides, (e) dielectric materials, (f) metals and metal alloys, (g) ceramic devices, (h) photomasks, (i) liquid crystal and flat panel displays, (j) printed circuit boards, (k) magnetic read/write heads, and (l) thin film heads.

9. The process of claim 8, wherein said metals and metal alloys are selected from the group consisting of aluminum and aluminum-silicon-copper alloy.

10. The process of claim 1, wherein the plasma ashing process is carried out at a temperature between room temperature and 350° C.

11. The process of claim 10, wherein said temperature is less than 200° C.

12. The process of claim 1, wherein said process is carried out in a down-flow, barrel, downstream, or direct ashing apparatus.

13. A process for removing an organic material from a surface of a substrate comprising the steps of:
   (a) placing said substrate in a reaction chamber;
   (b) introducing into said reaction chamber a halogen-free and hydrocarbon-free reactant gas comprising sulfur trioxide and, optionally, from 5 to 99 volume percent of at least one supplemental gas selected from the group consisting of oxygen, ozone, hydrogen, nitrogen, nitrogen oxides, helium, argon, and neon;
   (c) creating a plasma from said reactant gas; and
   (d) allowing said plasma to impinge upon said surface of said substrate containing said organic material for a time sufficient to ash said organic material but insufficient to attack said surface of said substrate.

14. The process of claim 13, wherein said reactant gas consists essentially of sulfur trioxide gas.

15. The process of claim 13, wherein said reactant gas consists essentially of sulfur trioxide and one said supplemental gas, said sulfur trioxide having a concentration within a range of about 1 to 95 volume percent.

16. The process of claim 13, wherein said reactant gas consists essentially of sulfur trioxide and at least two said supplemental gases, said sulfur trioxide having a concentration within a range of about 1 to 95 volume percent.

17. The process of claim 13, wherein said nitrogen oxides are selected from the group consisting of nitrous oxide ($N_2O$), nitric oxide (NO), nitrogen trioxide ($NO_3$), and nitrogen dioxide ($NO_2$).

18. The process of claim 13, wherein said organic material comprises a substance selected from the group consisting of polymerized and non-polymerized photoresists, photoresist residues, photosensitive and non-photosensitive organic compounds, paints, resins, multilayer organic polymers, organo-metallic complexes, sidewall polymers, via veils, metal fences, hybrid organic/inorganic compounds, dielectric materials, and organic spin-on-glass.

19. The process of claim 18, wherein said photoresists are selected from the group consisting of positive optical photoresists, negative optical photoresists, electron beam photoresists, X-ray photoresists, and ion-beam photoresists.

20. The process of claim 13, wherein said substrate is selected from the group consisting, entirely or in part, of (a) semiconductor wafers and devices comprised of silicon, polysilicon, germanium, III-V materials, and II-VI materials, (b) oxides, (c) nitrides, (d) oxynitrides, (e) dielectric materials, (f) metals and metal alloys, (g) ceramic devices, (h) photomasks, (i) liquid crystal and flat panel displays, (j) printed circuit boards, (k) magnetic read/write heads, and (l) thin film heads.

21. The process of claim 20, wherein said metals and metal alloys are selected from the group consisting of aluminum and aluminum-silicon-copper alloy.

22. The process of claim 13 wherein the plasma ashing process is carried out at a temperature between room temperature and 350° C.

23. The process of claim 22, wherein said temperature is less than 200° C.

24. The process of claim 13, wherein said process is carried out in a down-flow, barrel, downstream, or direct ashing apparatus.

25. The process of claim 13, wherein said sulfur trioxide is delivered to said reaction chamber from a storage vessel through a delivery manifold by independently heating said storage vessel and said delivery manifold to a temperature sufficient to maintain said sulfur trioxide in its gaseous state and thereby prevent condensation of said sulfur trioxide and by heating said reaction chamber to control the reaction rate of said sulfur trioxide and also prevent condensation of said sulfur trioxide.

26. The process of claim 25 wherein said temperature of said storage vessel is controlled isothermally.

27. The process of claim 25 wherein said storage vessel has a length and said temperature of said source vessel is controlled with a temperature gradient along its length.

28. The process of claim 25 wherein said temperature of said delivery manifold is maintained substantially uniform from said storage vessel to said reaction chamber.

29. The process of claim 25 wherein said temperature of said delivery manifold is varied along different portions of said delivery manifold.

30. The process of claim 25 wherein said reaction chamber is independently and substantially uniformly heated to said temperature.

31. The process of claim 25 wherein said sulfur trioxide is maintained in any mix of 0 to 100 volume percent of solid, liquid, or gaseous state in said storage vessel.

32. The process of claim 25 wherein said sulfur trioxide is maintained in any mix of 0 to 100 volume percent of its liquid or gaseous state in said delivery manifold, prior to injection into said reaction chamber.

33. The process of claim 25 wherein said sulfur trioxide is maintained in a uniform gaseous state in said reaction chamber.

34. The process of claim 25 wherein said sulfur trioxide is caused to preferentially and controllably condense on said substrate in said reaction chamber.

35. The process of claim 25 wherein said sulfur trioxide is cause to preferentially and controllably condense on any designated part of said reaction chamber.

36. The process of claim 25 wherein said sulfur trioxide is free of stabilizers in said storage vessel.

37. The process of claim 25 wherein said sulfur trioxide is in any mix of 0 to 100 volume percent of its gamma, beta, and alpha polymeric forms in said storage vessel.

* * * * *